United States Patent
Fjelstad et al.

(10) Patent No.: US 6,586,955 B2
(45) Date of Patent: Jul. 1, 2003

(54) METHODS AND STRUCTURES FOR ELECTRONIC PROBING ARRAYS

(75) Inventors: Joseph Fjelstad, Maple Valley, WA (US); John W. Smith, Horseshoe Bay, TX (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/793,791

(22) Filed: Feb. 27, 2001

(65) Prior Publication Data

US 2002/0000815 A1 Jan. 3, 2002

Related U.S. Application Data

(60) Provisional application No. 60/189,302, filed on Mar. 13, 2000.

(51) Int. Cl.[7] .............................................. G01R 31/02
(52) U.S. Cl. ....................................... 324/754; 324/761
(58) Field of Search ................................ 324/754, 765, 324/72.5, 758, 761, 762; 439/169, 174, 482, 912; 438/10, 15, 106

(56) References Cited

U.S. PATENT DOCUMENTS

| | | | |
|---|---|---|---|
| 4,450,042 A | 5/1984 | Purdes | 156/643 |
| 4,566,184 A | 1/1986 | Higgins et al. | 29/840 |
| 4,741,799 A | 5/1988 | Chen et al. | 156/643 |
| 4,757,256 A | 7/1988 | Whann et al. | 324/158 |
| 4,837,622 A | 6/1989 | Whann et al. | 324/158 |
| 4,941,941 A | 7/1990 | Austin et al. | 156/647 |
| 5,070,297 A | 12/1991 | Kwon et al. | 324/158 |
| 5,123,850 A | 6/1992 | Elder et al. | 439/67 |
| 5,148,265 A | 9/1992 | Khandros et al. | 357/80 |
| 5,148,266 A | 9/1992 | Khandros et al. | 357/80 |
| 5,177,439 A | 1/1993 | Liu et al. | 324/158 |
| 5,207,866 A | 5/1993 | Lue et al. | 156/647 |
| 5,225,037 A | 7/1993 | Elder et al. | 156/644 |
| 5,239,260 A | 8/1993 | Widder et al. | 324/158 |
| 5,414,298 A | 5/1995 | Grube et al. | 257/690 |
| 5,436,568 A | 7/1995 | Woith | 324/758 |
| 5,441,600 A | 8/1995 | Smits | 216/51 |
| 5,455,390 A | 10/1995 | DiStefano et al. | 174/262 |
| 5,491,427 A | 2/1996 | Ueno et al. | 324/754 |
| 5,500,604 A | 3/1996 | Swarbrick et al. | 324/754 |
| 5,513,430 A | 5/1996 | Yanof et al. | 29/846 |
| 5,518,964 A | 5/1996 | DiStefano et al. | 437/209 |
| 5,525,545 A | 6/1996 | Grube et al. | 437/209 |
| 5,613,861 A | 3/1997 | Smith et al. | 439/81 |
| 5,623,213 A | 4/1997 | Liu et al. | 324/754 |
| 5,625,298 A | 4/1997 | Hirano et al. | 324/754 |
| 5,808,874 A | 9/1998 | Smith | 361/769 |
| 5,913,109 A | 6/1999 | DiStefano et al. | 438/117 |
| 6,096,574 A * | 8/2000 | Smith | 438/106 |
| 6,232,143 B1 * | 5/2001 | Maddix et al. | 327/754 |
| 6,238,938 B1 * | 5/2001 | Smith | 438/10 |

* cited by examiner

Primary Examiner—Kamand Cuneo
Assistant Examiner—Minh N. Tang
(74) Attorney, Agent, or Firm—Lerner, David, Littenberg, Krumholz & Mentlik, LLP

(57) ABSTRACT

A probe card for testing electronic elements includes a layer of dielectric material provided with a plurality of cavities supported on a substrate. A mass of fusible conductive material having a melting temperature below about 150° C. is disposed in each of said cavities, the dielectric material electrically insulating the masses of fusible conductive material from one another. A probe tip of conductive material having a melting temperature greater than about 150° C. is provided at one common end of each of the masses of fusible conductive material. The probe contacts are separated from an adjacent probe contact by at least one channel formed with the layer of dielectric material.

65 Claims, 6 Drawing Sheets

METHODS AND STRUCTURES FOR ELECTRONIC PROBING ARRAYS

CROSS REFERENCE TO RELATED APPLICATIONS

The present application claims priority to U.S. Provisional Application No. 60/189,302 filed Mar. 13, 2000, the disclosure of which is incorporated herein by reference.

The present invention relates in general to the field of electronic testing of semiconductor wafers and chip circuitry using a test probe array, and methods of making same.

BACKGROUND OF THE INVENTION

Semiconductor chips are typically manufactured en masse in so called wafers. Each wafer is made of a semiconductor material and typically is four to twelve inches in diameter. Each wafer typically contains a plurality of identical chips each connected and adjacent one another, but separated by portions of the wafer called scribe lines. The scribe lines do not contain devices which are required in the finished chips. Generally, the individual chips are separated (or "diced") from one another for packaging and/or electrical connection to other chips. Prior to the further processing and connection, however, the chips are desirably tested in order to determine which chips are defective so that further expense in processing does not occur on the defective chips. The testing is typically called "probing." This testing may be accomplished by testing a single chip or multiple chips in defined rows on the wafer, and then repeating the testing operation with other chips or rows. Alternatively, the chips may be separated from one another first and then tested individually. Typically, probe contacts are abutted against (and preferably gently scrubbed or scraped against) respective chip contacts so that the chip circuitry may be tested. The process of testing one chip or a few chips at a time is slow and hence costly. Recently, simultaneous testing of a full undiced wafer has been discussed and is being tried by several manufacturers.

When probing chips or wafers, it has been important to have a planar set of probe contacts so that each probe contact can make simultaneous electrical contact to a respective chip contact. It has also been important to have the contacts on the wafer coplanar. Typically, if the tips of the probe contacts do not lie in approximately the same plane, or if some of the contacts on the wafer are out of plane, more force must be exerted on the back of the probe in an effort to engage all of the probe contacts with the chip contacts. This typically leads to non-uniform forces between the tips of the probe contacts and the wafer contacts. If too much force is placed on any one probe contact, there is a potential to harm the chip contacts. Planarity and a balanced probe contact force is also important in order to have approximately the same ohmic resistance across all of the probe contacts so that the electrical signals have approximately the same level of integrity. Maintaining similar ohmic probe to chip contact resistance is especially important for accurate testing of chips that are designed to be run at high speeds. For these high speed chips, it is also important to control the impedance of the probe tester (resistance, capacitance and inductance) as a whole to maintain the integrity of the electrical signals.

U.S. Pat. No. 4,566,184 discloses a probe card that has a board with an aperture in it. The board has conductive traces on a top surface. A bottom surface of the board has a conductive layer which is used as a ground layer. The conductive traces are connected to electroplated probe contacts that are located below the board aperture and connected to the traces by way of wire bonded connections. The assembly is encapsulated (such as by an acrylic potting compound) in order to hold the probe contacts in place and protect the wire bonds. The wire bonded wires connecting the probe board to the contacts provide an uncontrolled impedance path that will introduce added inductance into the probe system. Also, because of the limitations inherent with such wire bonded connections, it would be difficult to make connections to high density chip contacts and area array chip contacts without substantial fear that the wires would short against each other.

U.S. Pat. Nos. 4,757,256 and 4,837,622 disclose a probe tester that makes use of an array of cantilevered, resilient wires each of which extends from the surface of the probe card downwardly towards the chip contacts. The probe contact array includes an annular frame, and two sets of spaced apart probe wires bonded to the annular frame by a curable resin material. The probes are bonded in alignment position relative to respective connection pads formed on each of the chips on the wafer for individual testing of chips on an undiced wafer. The adjacent probe wires of both sets are substantially parallel with each other, one set of probe wires being spaced apart from the other set. One set of probes is adapted for electrical connection to the first set of traces on the lower surface, and the other set of probes is adapted for electrical connection to the second set of traces on the upper surface of the printed circuit probe card, in all cases by way of the lower surface thereof. This type of probe card has difficulty when the center-to-center distance ("pitch") of the chip contacts becomes fairly small or when the contacts are not located on a periphery of the chip itself. Also, the distended wires may cause excessive scrubbing of the chip contacts and shorting of adjacent probe wires during testing or handling of the probe card.

U.S. Pat. No. 5,613,861 discloses a spring contact probe designed to eliminate the need to create uniform solder bumps or uniform contacting pressure. The spring contacts are formed of a thin metal strip which is in part fixed to a substrate and electrically connected to a contact pad on the substrate. The free portion of the metal strip not fixed to the substrate bends up and away from the substrate because of a stress gradient formed into it. When the contact pad on a device is brought into pressing contact with the free portion of the metal strip, the free portion deforms and provides compliant contact with the contact pad. Since the metal strip is electrically conductive or coated with a conductive material, the contact pad on the substrate is electrically connected to the contact pad on the device via the spring contact.

U.S. Pat. No. 5,177,439 discloses an interface probe card for testing unencapsulated semiconductor devices. The probe card is manufactured from a semiconductor substrate material. A plurality of protrusions is formed in the top surface of the substrate. Each protrusion is coated with a layer of conducting material. The protrusions are patterned to match either a peripheral or an area array of electrode pads on the device to be tested. Conductive interconnects couple each of the plurality of coated protrusions to an external test system. The probe card design disclosed in this patent has the benefit of using semiconductor type equipment for its manufacture but makes a somewhat rigid connection during a probe operation.

U.S. Pat. No. 5,513,430 discloses a method for manufacturing a probe card. A layer of resist is formed on a plating base. The layer of resist is exposed to radiation and developed to provide angled, tapered openings exposing portions of the plating base, such as by using X-ray radiation. An electrically conductive material is electroplated on the exposed portions of the plating base and fills the angled, tapered openings. The layer of resist and portions of the plating base between the electroplated conductive material are removed. The electrically conductive material forms the probe card probes which are angled and tapered. In addition, the compliant probe card probes may be stair-step shaped if more conventional UV radiation is used in defining the tapered openings in the plating base.

U.S. Pat. No. 5,070,297 discloses a wafer level probe tester where all of the chips are tested simultaneously prior to a dicing operation. The disclosed probe tester is created using standard wafer processing techniques to embed active testing and interfacing circuitry in the probe's base silicon substrate. Each probe tester has a plurality of probe contacts or tips that are electrically connected to the probe tester's circuitry. In this disclosure, the probe tester may also have memory for storing the probe data after the probe tester has probed a wafer. While the ability to have internal circuitry in the probe tester potentially increases the ability to test the chips in the wafer at higher speeds, it has the drawback of requiring extra processing of the tester's base substrate. As more and more circuitry is added across the face of the tester's base substrate, the probe tester encounters the same problems encountered in the field with wafer-scale integration techniques, namely the yield of the circuitry within the base substrate will be adversely affected as more circuitry is added to the base substrate. The problem usually occurs when very high yielding circuitry is used with lower yielding circuitry. The aggregate yield of the resulting circuitry is never any higher than the lowest yielding circuitry, leading to a more expensive process and structure.

Bumped flex test technology has been used by several manufacturers (also known as "membrane probe card technology"). Test circuits are created on a membrane, such as a thin flexible polymeric substrate or silicon substrate. Typically such test circuits are limited to diameters of approximately 3 inches and incorporate bump contact feature sizes of 50 microns minimum line and space. Such feature sizes are necessary to access the I/O lands of the IC device. Such contact bumps can be as small as 50 microns in both diameter and height. The simplest method of creating the contact bumps is by deforming the metal from the back side by use of a forming die consisting of pins that are located where the contact bumps are to be located. This method works very effectively but is limited in terms of minimum size of the bump that can be produced and in terms of performance because the cavity created during the bump formation can be a source of weakness. In addition, such contact bumps normally must be over plated after the forming process with a suitable contact finish such as gold. This is not only cumbersome but can add to whatever non-planarity that was present in the part initially.

Another method used for creating the bumps, especially micro-bumps or metal contact bumps having dimensions of less than 250 microns across and rising 25 to 100 microns above the surface, is to uniformly plate up the bumps from the surface of the conductor. This has been performed by several manufacturers and is the method of choice for creating uniform contact bumps. These methods for creating a membrane probe card have been seen as either cost prohibitive or have been viewed as impractical for testing of printed circuit boards ("PCBs"). This is due perhaps to the intrinsically high cost of the test circuits and the small and delicate nature of the test circuits.

Another membrane probe tester for testing unpackaged chips having flip chip solder balls attached to their contacts is shown in U.S. Pat. No. 5,062,203. The '203 Patent does not make use of the aforementioned bump contacts because they can deform or damage the flip chip solder balls on the chip's contacts and typically have a difficult time maintaining contact with the solder ball's curved surface. Instead, this reference uses a thin film of flexible material having recessed conductive vias so that the tips of each solder ball can be captured therein. Other flex based probe card solutions are disclosed in U.S. Pat. Nos. 5,123,850; 5,225,037; 5,436,568; 5,491,427; 5,500,604; 5,623,213; 5,625,298; 5,239,260.

The technology disclosed in commonly assigned U.S. Pat. Nos. 5,148,265; 5,148,266; 5,414,298; 5,455,390; 5,518,964; 5,808,874; and 5,525,545; and pending U.S. patent application Ser. No. 09/405,029 entitled, "Method and Structures For Electronic Probing Arrays", filed on Sep. 24, 1999 is also relevant to the present invention. The disclosures in all such recited commonly assigned patents and patent application are hereby incorporated by reference herein.

Notwithstanding the positive results of the aforementioned commonly owned inventions, still further improvements would be desirable. As previously noted, the process of testing one chip or a few chips at a time is slow and hence costly. It is therefore desirable to provide a test probe for simultaneously testing all of the chips in a wafer, or in other arrays of chips which have a multitude of contacts. By way of example, memory chips arranged in a 5×6 array will have approximately one hundred contacts, while microprocessor chips in a similar array will have approximately five hundred contacts. Due to the very small center-to-center contact distance in these chips, a very high density of contacts is realized. This necessitates the construction of a probe having corresponding center-to-center probe tip dimensions in one-to-one positional relationship with the chip contacts. The ability to test a plurality of chips in, for example, the aforesaid arrays using known parallel test methods, requires that each test probe occupy a minimum of real estate on the wafer card. At the same time, probe density must accommodate the wiring density of each probe to the test computer which will be used during the probing process to determine the existence of defective chips.

As previously discussed, it has been generally important to have a planar set of probe contacts so that each probe contact can make simultaneous electrical contact to a respective chip contact. The typical failure mode of such a probe card is the absence of flexibility to allow the probe contacts to contact the non-planar surfaces of the chip contacts. These circumstances result in a number of inherent problems during the probing process as described hereinabove. The foregoing issues of probe contact density and planarity are addressed by the wafer probe card of the present invention.

SUMMARY OF THE INVENTION

In accordance with one embodiment of the invention, there is provided a probe card for testing electronic elements, the probe card comprising a substrate, a layer of dielectric material having a plurality of cavities therein supported on the substrate, a mass of fusible conductive material having a melting temperature below about 125° C. disposed in each of the cavities, the dielectric material electrically insulating the masses of fusible conductive material from one another, and a probe tip of conductive material having a melting temperature greater than about 125° C. at one common end of each of the masses of fusible conductive material, the layer of dielectric material having a plurality of channels formed therein, whereby each of the mass of fusible conductive material is surrounded by the dielectric material forming a probe contact, each of the probe contacts being separated from an adjacent probe contact by at least one of the channels.

In accordance with one embodiment of the invention, there is provided a probe card for testing electronic elements, the probe card comprising a substrate including electrical circuitry thereon having contacts, a layer of dielectric material having a plurality of cavities therein supported on the substrate, a mass of fusible conductive material having a melting temperature below about 150° C. disposed in each of the cavities, each of the masses of fusible conductive material being bonded to one of the contacts, and the dielectric material electrically insulating the masses of fusible conductive material from one another, and a probe tip of conductive material having a melting temperature greater than about 150° C. at one common end of each of the masses of fusible conductive material, and the layer of dielectric material having a plurality of channels formed therein, whereby each of the masses of fusible conductive material is surrounded by the dielectric material forming a probe contact, each of the probe contacts being separated from an adjacent probe contact by at least one of the channels.

In accordance with one embodiment of the invention, there is provided a probe card test assembly comprising an electronic element having a plurality of contacts thereon; and a probe card comprising a substrate, a layer of dielectric material having a plurality of cavities therein supported on the substrate, a mass of fusible conductive material having a melting temperature below about 150° C. disposed in each of the cavities, and the dielectric material electrically insulating the masses of fusible conductive material from one another, and a probe tip of conductive material having a melting temperature greater than about 150° C. at one common end of each of the masses of fusible conductive material, at least one of the probe tips in contact with one of the contacts on said electronic element, and the layer of dielectric material having a plurality of channels formed therein, whereby each of the masses of fusible conductive material is surrounded by the dielectric material forming a probe contact, each of the probe contacts being separated from an adjacent probe contact by at least one of the channels.

In accordance with one embodiment of the invention, there is provided a method of making a probe card comprising forming a plurality of cavities in a sacrificial first substrate, depositing a first metal over the substrate and into the cavities to form a plurality of probe tips, depositing a mass of fusible conductive material over each of the probe tips, providing a substrate having a plurality of contacts on one surface thereof facing the sacrificial substrate, bonding each of the masses of fusible conductive material to a corresponding one of the contacts on the second substrate, providing a dielectric material between the first and second substrates surrounding each of the masses of fusible conductive material to form a dielectric encapsulant layer encapsulating each of the masses of conductive fusible material, removing the sacrificial first substrate, and at least partially separating each the masses of conductive fusible material within said encapsulant layer to form a plurality of individual contact probes each surrounded by the encapsulant layer.

In accordance with one embodiment of the invention, there is provided a method for testing an electronic element using a probe card, the method comprising a probe card having a substrate, a layer of dielectric material having a plurality of cavities therein supported on the substrate, a mass of fusible conductive material having a melting temperature disposed in each of the cavities, and the dielectric material electrically insulating the masses of fusible conductive material from one another, and a probe tip of conductive material having a melting temperature greater than the melting temperature of the mass of fusible conductive material at one common end of each of the masses of fusible conductive material, and the layer of dielectric material having a plurality of channels formed therein, whereby each of the masses of fusible conductive material is surrounded by the dielectric material forming a probe contact, each of the probe contacts being separated from an adjacent probe contact by at least one of the channels; positioning of the probe card opposing an electronic element having a plurality of contacts thereon, at least one of the contacts engaged by one of the probe tips; heating the mass of fusible conductive material to at least the melting temperature of the fusible conductive material, sending signals to the probe card and the electronic element.

BRIEF DESCRIPTION OF THE DRAWINGS

Other objects and advantages of the invention including the basic design and the nature of the improvements thereon will appear from the following description taken in conjunction with the accompanying drawings, in which.

DETAILED DESCRIPTION OF THE DRAWINGS

Figure 1:
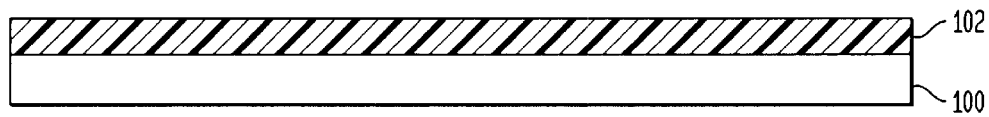
FIGS. 1 through 14 are sequential drawings in front elevation showing a method of making a probe card in accordance with the present invention.
Figure 2:
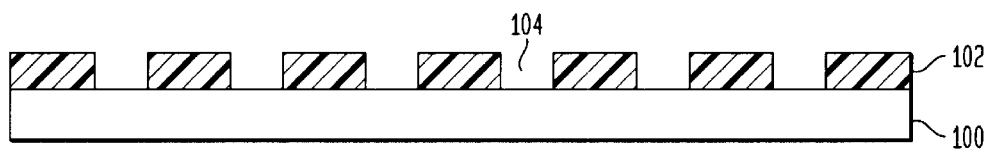

In describing the preferred embodiments of the subject matter illustrated and to be described with respect to FIGS. 1–19, specific terminology will be resorted to for the sake of clarity. However, the invention is not intended to be limited to the specific terms so selected and is to be understood that each specific term includes all technical equivalents which operate in a similar manner to accomplish a similar purpose.

Referring generally to FIGS. 1–14, there will now be described one method of making a probe card in accordance with one embodiment of the present invention. A single crystal silicon wafer 100 which has not been circuitized either externally or internally, is provided on one planar surface with a mask 102 of suitable material which may be patterned, for example, photoresist material. The mask 102 is selectively exposed and developed such that areas of the mask are hardened and other areas are removed to expose the top surface of the silicon wafer 100. The exposed areas 104 generally correspond to the pattern of chip contacts to be tested using the probe card. Each exposed area 104 will correspond to the location of a probe tip which will be formed in the probe card. The precise location of the probe tips can be created in an area array, i.e., an array of probe tips, disposed throughout a region of the probe card such as in a matrix corresponding to the location of the chip contacts. Such an array of probe tips will generally have a small pitch or center-to-center distance, for example, on the order of about 75 to 250 microns for a very fine pitch. Larger pitches such as from 75 to 500 microns are also contemplated, as well as larger pitches greater than 500 microns. One limitation on the pitch or center-to-center distance of the probe tips 110 is the dimensions of the base of the probe tip, i.e., the opening of the cavity 106 at the surface of the wafer 100. The probe tip is normally a "square pyramid" based on the usual etching properties of single crystal silicon. The size of the base is related to the height of the pyramid because the cavities 106 formed in the silicon wafer 100 are normally square pyramid shaped with 60° angles. Therefore, if the probe tip height is 25 microns, then the base is about 50 microns and a 75 micron probe pitch is obtainable. Accordingly, for very fine pitches, probe tip heights of about 25–50 microns are desirable. However, probe tip heights of from 50–75 microns and from 75–175 microns are also desirable. Large heights of the probe tip are also contemplated with larger pitches. Therefore, a chip or wafer having contacts disposed in a high-density area may be contacted and tested by the probe card of the present invention.

Figure 3:
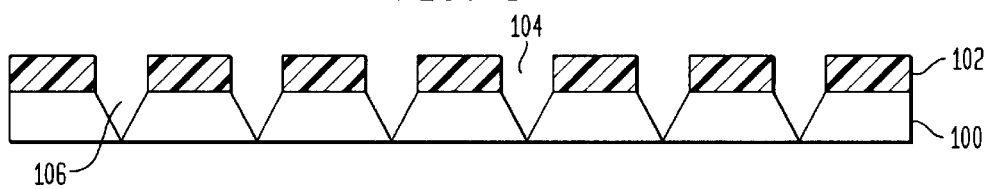

Using the exposed areas 104 of the mask 102, the silicon wafer 100 is etched as shown in FIG. 3 to form a plurality of cavities 106. By using a substrate material such as polycrystalline, polymers, metals and the like, other cavity shapes 106 using techniques such as, by way of example, laser ablation, can be achieved, such as rectangular, round, oval, triangular, polygonal and the like. It is only required that the substrate material can be removed without removing the probe tip material. By way of example, the cavities will have a depth of about from 25 to 50 microns. The cavities will generally have a pyramidal shape which is the result of anistropically etching a single crystal layer of silicon material which forms the wafer 100.

One suitable etching is an anisotropic etching process which includes the use of both chemical etchants and plasmas. For example, suitable chemical etchants include aqueous solutions of potassium hydroxide, sodium hydroxide, hydrofluoric acid and lithium hydroxide. Other suitable chemical etchants include aqueous solutions of hydrazine and ethylenediamine/pyrocatechol. Anisotropic etching can also be performed by using a plasma process using fluorine and/or chlorine chemistry as is well known in the semiconductor manufacturing art. Anisotropic etching of silicon is also known from U.S. Pat. Nos. 5,441,600; 5,207,866; 4,941,941; 4,741,799; and 4,450,042, the disclosures of which are incorporated herein by reference.

Figure 4:
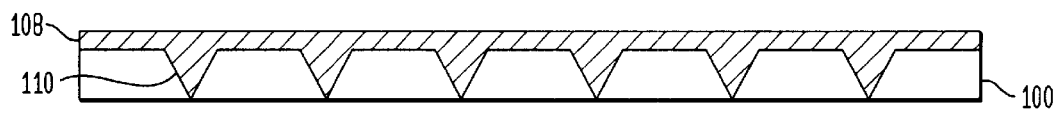
Figure 5:
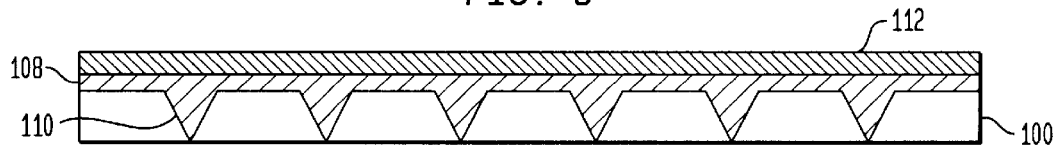

The mask 102 is removed and a metal layer 108 is deposited over the exposed top surface of the silicon wafer 100 and into the cavities 106 as shown in FIG. 4. The metal within the cavities 106 form probe tips 110 of corresponding size and shape. A pyramid-like shape is preferred because the probe tip 110 can more easily penetrate any oxide layer on the contact and is the shape generally obtained when anisotropically etching single crystal silicon wafers. The probe tips 110 must be formed of electrically conductive material which is in a solid form at the operating temperature of the device being tested. Preferably, the probe tips 110 is formed from any suitable hard metal such as osmium or rhodium, and preferably tungsten. By forming the probe tips 110 of a hard metal, it allows the tips to retain their sharp features and tip despite repeated engagement with contacts of numerous electronic elements when using the probe card. The presence of the sharp features also increases the ability of the probe tips 110 to break through any oxide layer on the engaged contacts thereby assuring reliable electrical connection during the testing process. Optionally as shown in FIG. 5, a copper layer 112 may be deposited over the exposed surface of the metal layer 108. The copper layer 112, if present, is cheaper and faster to plate than the harder and preferred tungsten, rhodium or osmium layer. As the ULMS is generally a very corrosive material, the copper layer 112 will function to protect the probe tip material as an intervening layer. Therefore, other electrically conductive materials other than copper may be used, e.g., nickel, tin and the like.

Figure 6:
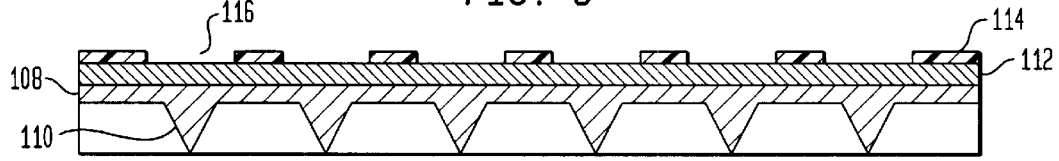
Figure 7:
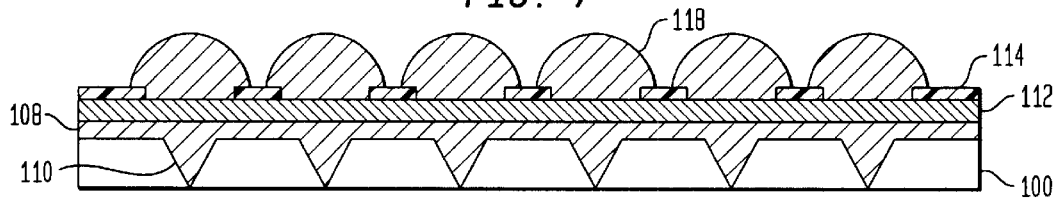

A solder mask 114 is applied to the top surface of the copper layer 112 if present, or to the top surface of the metal layer 108. As shown in FIG. 6, the solder mask 114 has been deposited over the top surface of the copper layer 112 and patterned to form open areas 116 overlying the probe tips 110. Using the solder mask 114, ultra low melt solder ("ULMS") is deposited through the open areas 116 onto the exposed portions of the top surface of the copper layer 112, or if no copper layer is used, on the exposed top surface of metal layer 108. The ultra low melt solder forms a plurality of core elements 118 as shown in FIG. 7. The ultra low melt solder are those, for example, disclosed and described in U.S. Pat. No. 5,808,874. The core elements 118 will therefore be in a general liquid or semi-liquid form at the operating temperature of the chip or device being tested. By attaining a liquid or semi-liquid state, the probe card may deform as to be described hereinafter without fracturing the core elements 118 which would potentially cause a discontinuous circuit break between the probe tips 110 and circuit testing equipment.

By way of example, the melting temperature of the ULMS desirably is within or below the normal operating temperature of the semiconductor elements in the wafer or chip to be tested, or only slightly above the normal operating temperature range. The normal expected range of operating temperatures of the semiconductor elements will depend upon the configuration and composition of the element, and upon the operating environment encountered in service. Typical silicon-based semiconductor elements are designed to operate at about 40° C. to about 85° C. Where the ULMS melts or freezes over a range of temperatures, the term "melting temperature" as used in this disclosure should be understood as referring to the solidus temperature, i.e., the temperature at which the metal begins to melt (when heated slowly) or completes freezing (when cooled slowly). Preferably, the melting temperature of the ULMS is above normal room temperature (20° C.) so that the conductive material can be handled conveniently in solid form during the steps discussed below in making the probe card. Thus, the ULMS desirably has a melting temperature of less than about 150° C., preferably less than about 125° C. and more preferably less than about 100° C. Melting temperatures below about 85° C. are more preferred, and melting temperatures below about 65° C. are even more preferred. The range of melting temperatures between about 25° C. and 65° C. is particularly preferred, and melting temperatures between about 35° C. and about 55° C. are especially preferred. However, lower melting temperatures can be employed if the production process is altered to accommodate the lower melting temperature. For example, where a ULMS which melts at a temperature below room temperature is employed, the material and the adjacent parts can be kept at sub-ambient temperatures during those process steps where the material must remain solid. Conversely, where the operating temperature of the microelectronic elements is higher than the typical ranges mentioned above, higher melting fusible materials can be employed.

Among the suitable low-melting point solders are the following:

| ELEMENT | COMPOSITION 1 WEIGHT % | COMPOSITION 2 WEIGHT % |
|---|---|---|
| Sn | 18.5 | 10.5 |
| Bi | 45 | 40 |
| Pb | 24 | 21.5 |
| In | 10 | 20 |
| Cd | 9.5 | 8 |
| Melting Temperature | 55° C. | 50° C. |

Solders having compositions intermediate between the two low-melting point solders illustrated in Table 1 can be used. Other suitable low-melting solders include the solder sold under the trademark Indalloy by the Indium Corporation of America, in Clinton, N.Y. For example, Indalloy Number 8 has a melting point of about 93° C., whereas Indalloy Number 117 has a melting point of about 47° C. Still other low-melting solders include other metals and alloys selected from cadmium, bismuth, tin, gallium, lead and indium in various proportions, with or without other metals. Additional ULMS include mercury and mercury containing alloys.

Figure 8:
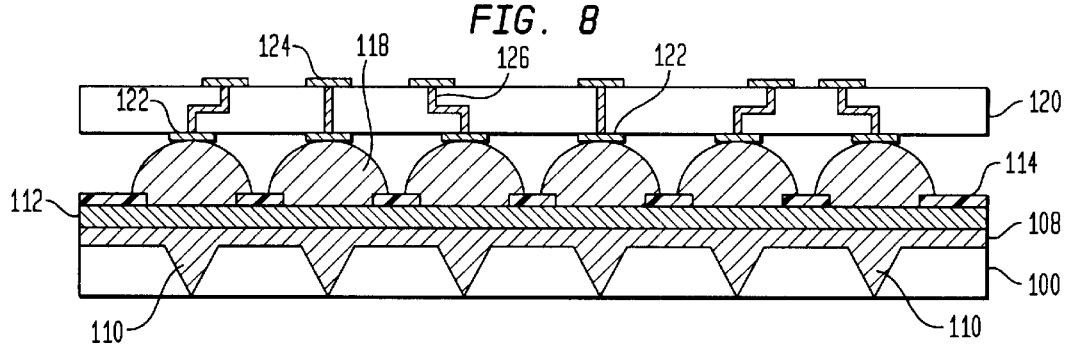

Referring to FIG. 8, a printed circuit board 120 is provided having a plurality of contacts 122 on one surface of the board arranged in a corresponding matrix to the matrix of the core elements 118. The contacts 122 are electrically connected to contacts 124 on the other surface of the printed circuit board 120 by means of internal traces or vias 126. The printed circuit board 120 may be formed from an inexpensive dielectric material such as a standard reinforced epoxy or bisnalimide triazine material. It is to be understood that each contact 122 may be electrically coupled to one or more contacts 124 via the conductive traces or vias 126, and vice versa. Additionally, it is also contemplated that certain contacts 122 may be blind contacts without electrical connection to one of the contacts 124. The specific connection between the contacts 122, 124 will be dependent upon the circuitry of the chip or electronic device being tested. Thus, it should be understood that the circuit of the printed circuit board generally will correspond to the test circuit required for the particular chips or electronic device being tested by the probe card.

Figure 9:
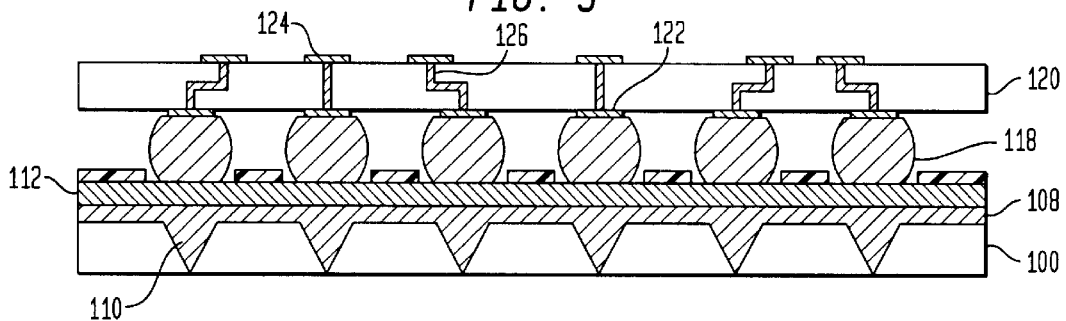
Figure 10:
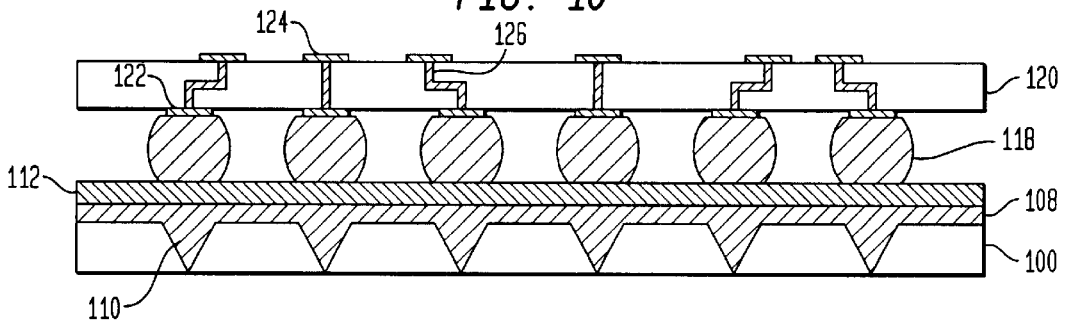
Figure 11:
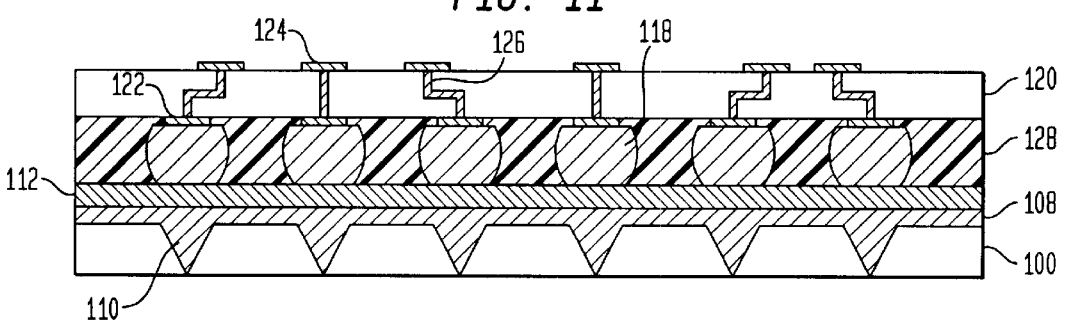

The printed circuit board 120 is juxtaposed with the silicon wafer 100 so as to engage each of the contacts 122 with a corresponding core element 118. The assembly is heated to reflow the ultra low melt solder forming each of the core elements 118. This results in each of the core elements 118 being solder bonded to its corresponding contact 122 on the printed circuit board 120 as shown in FIG. 9. Subsequently, the solder mask 114 may be removed using a suitable stripper as shown in FIG. 10.

Whether or not the solder mask 114 has been removed, a dielectric polymer layer such as a compliant layer 128 is formed between the printed circuit board 120 and copper layer 112 or the tungsten layer 108 if the copper layer is not present. The compliant layer 128, by way of example, is in the nature of a flowable polymer material which can be cured to form the compliant layer intimately surrounding the core elements 118. The compliant layer 128, after curing, will have some resistance to deformation. The compliant layer 128 may be a solid or a gel, which may include voids and may therefore take the form of a solid or gel foam. Preferably, the compliant layer 128 will have an elastic modulus less than about 100,000 lbs. per square inch, while lower values of elastic modulus are preferred. The compliant layer 128 desirably remains compliant and cohesive over a range of temperatures encompassing at least the range of the melting temperature of the core elements 118 to above the normal operating temperature of the chips being tested by the probe card. The compliant layer 128 desirably retains these properties from about 20° C. or below to about 45° C. or higher. Preferably, the compliant layer 128 retains properties in the aforesaid ranges from about 0° C. or below to about 60° C. or above. Most preferably, the compliant layer 128 retains the desired properties from about −65° C. or below to about 150° C. or above.

The flowable material used to form compliant layer 128 should be capable of flowing, prior to cure, at temperatures below the melting temperature of the ULMS of core elements 118. To assure complete filling of space by the flowable material, the flowable material may be injected under pressure. Also, the space may be evacuated prior to injection of the flowable material. Techniques for evacuation of a space between a flexible sheet and wafer and for injection of flowable, curable materials into such a space are further disclosed in International Patent Publication No. 96/02068 and U.S. Pat. No. 5,913,109, both of which are incorporated herein by reference. Suitable flowable materials for forming the compliant layer 128 include polymer compositions which are initially in the form of liquids but which cure by chemical reaction of their ingredients to form a solid or gel. Among the compositions that can be used are silicones, epoxies and urethanes. Particularly suitable compositions include silicone elastomers of the type sold under the designation Sylgard® 577 by the Dow Corning Corporation of Midland, Mich., Dow Corning® 6811 microelectronic encapsulant and flexibized epoxies. The reaction-curable material may be provided as two mutually reactive components which are mixed immediately prior to introduction of the material into the space and which react spontaneously with one another at ambient temperature. Other reactive polymer compositions can be activated by application of ultraviolet light. The curing step can also be initiated or accelerated by heating the reactive polymer composition. Some or all of the curing step may entail temperatures above the melting temperature of the fusible material in core elements 118.

Figure 12:
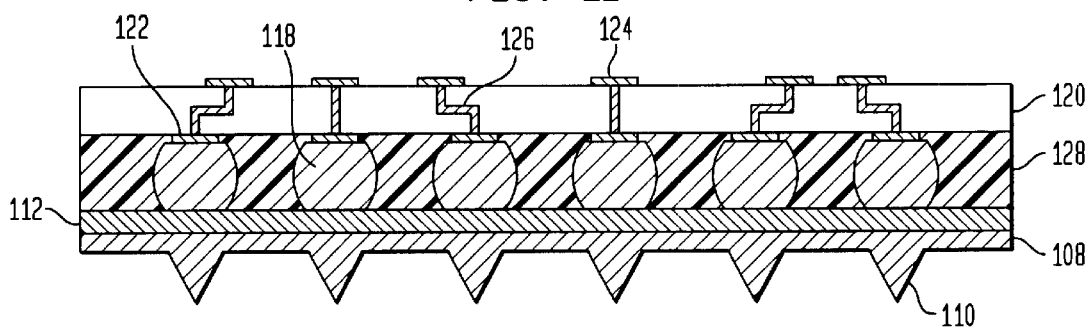

The silicon wafer 100 is removed from the metal layer 108 as shown in FIG. 12 to expose the probe tips 110 using, for example, a suitable etchant solution that preferentially etches silicon material over the material of the metal layer 108, e.g., tungsten. Suitable etchant solutions for removing the silicon wafer 100 are well known in the art, for example, those noted hereinabove.

Figure 13:
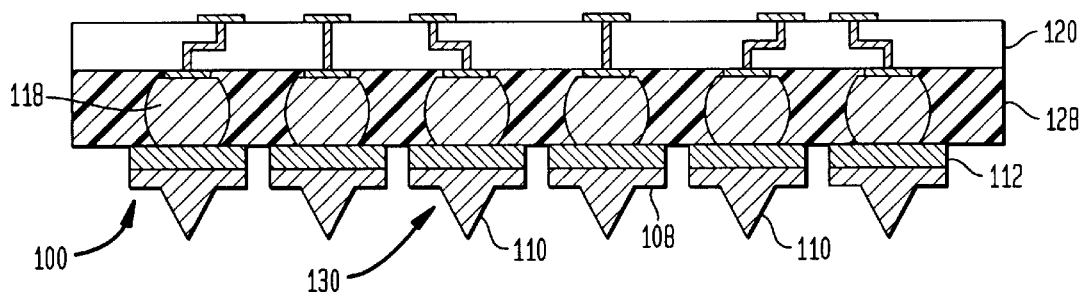
Figure 14:
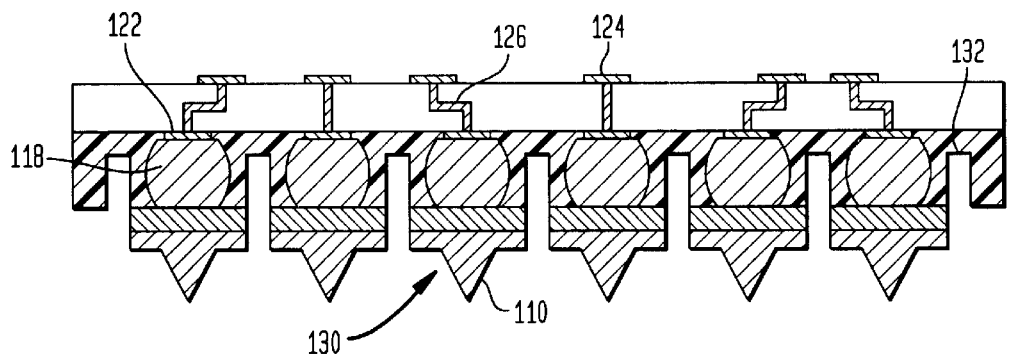
Figure 15:
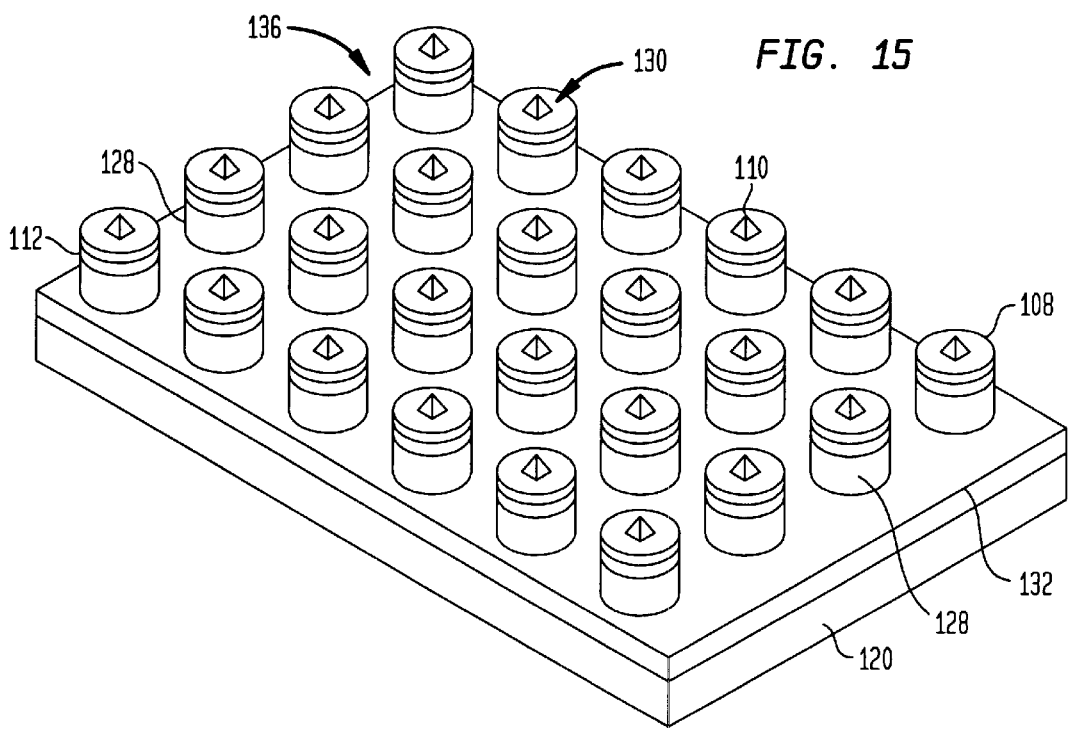
FIG. 15 is a perspective view of a probe card constructed in accordance with the present invention.

Referring now to FIG. 13, using a suitable mask, not shown, portions of the exposed metal layer 108 and the copper layer 112, if present, are selectively removed to define individual isolated probe contacts 130. Alternately, those portions of the metal layer 108 and copper layer 112 to be removed may be removed using a laser or other such ablation method. The shape of the resulting probe contacts 130 can be any desired shape, such as rectangular, round, oval, polygonal, triangular and the like. Selective portions of the compliant layer 128 surrounding each of the contact probes 130 are removed using, for example, laser ablation, to isolate or singulate the individual probe contacts 130 by forming channels 136. As shown in FIGS. 14 and 15, the ablation of the compliant layer 128 does not remove the compliant layer so as to expose the bottom surface of the printed circuit board 120. In this regard, a thin layer 132 of the compliant material is maintained over the surface of the printed circuit board 120. However, as shown in FIG. 16, the compliant layer 128 may be ablated all the way down to the printed circuit board 120 thereby exposing portions of the circuitry 134 on the surface of the printed circuit board 120.

The channels 136 facilitate independent movement of each probe contact 130 with respect to an adjacent probe contact when the probe card 140 is used for probing an electronic element to be tested. Preferably, this process, as noted hereinabove, is accomplished using a laser to accurately ablate the cured encapsulant dielectric compliant layer 128 without also ablating the printed circuit board 120. Alternatively, the channels 136 may be created by a high speed controlled depth cutting saw, abrasive jet cutting apparatus, or water jet cutting apparatus.

Figure 16:
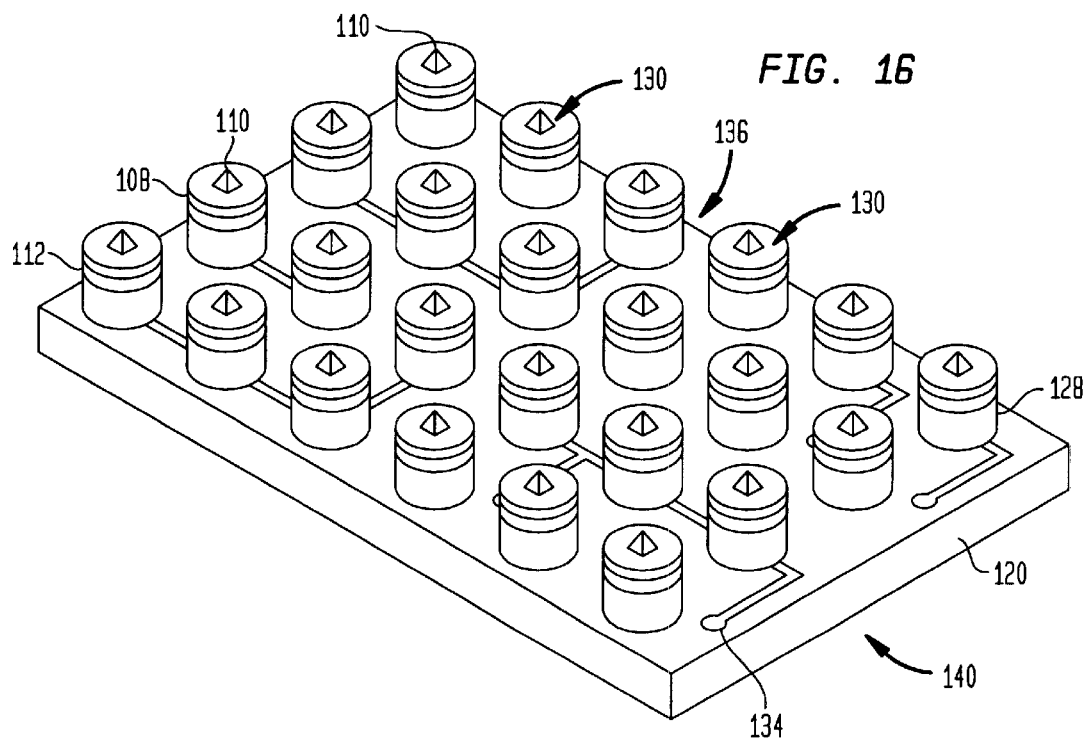
FIG. 16 is a perspective view of a probe card constructed in accordance with the present invention.
Figure 17:
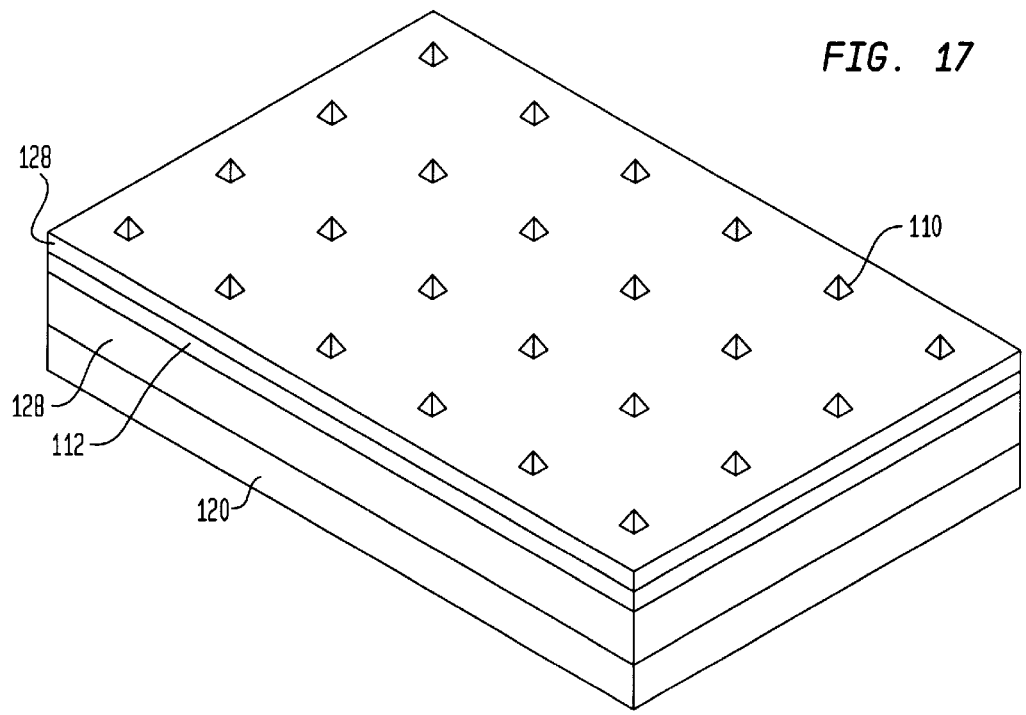
FIG. 17 is a perspective view of a probe card constructed in accordance with the present invention.
Figure 18:
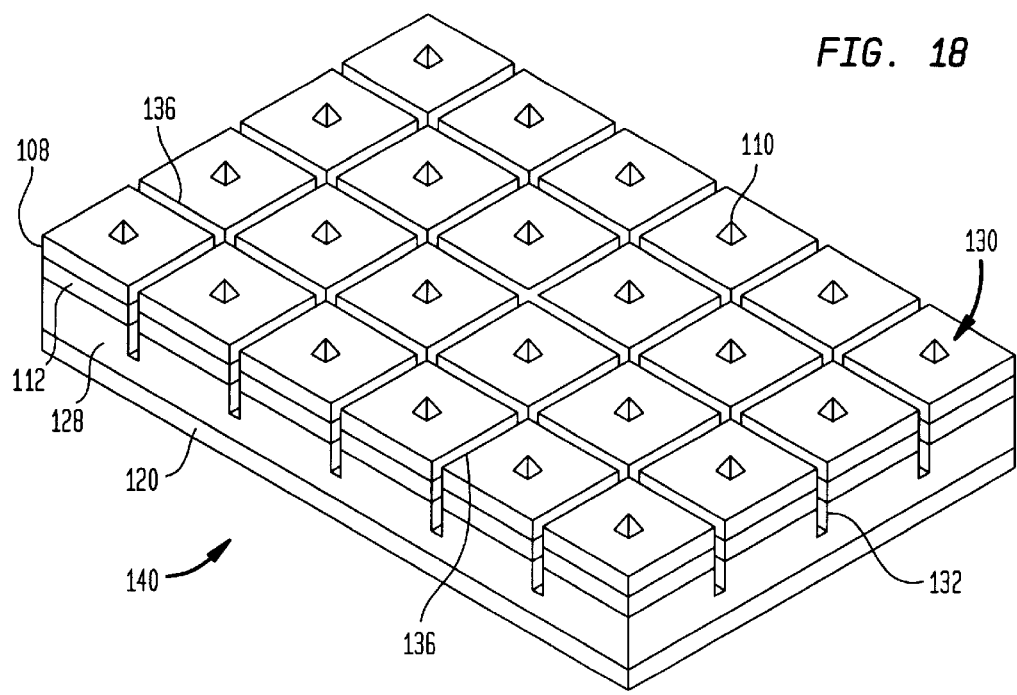
FIG. 18 is a perspective view of a probe card constructed in accordance with the present invention.
Figure 19:
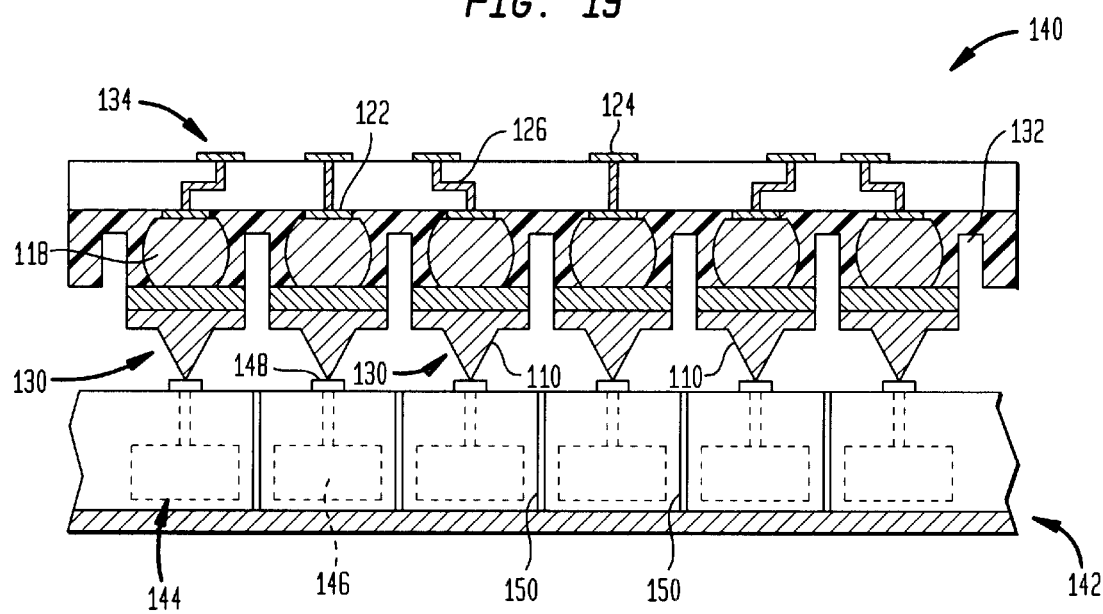
FIG. 19 is a front elevation showing a probe card of the present invention in operative association with an electronic element.

In a variant of the present invention as shown in FIGS. 17 and 18, the channels 136 divide the probe card 140 into a plurality of probe contacts 130 having a rectangular shape as opposed to the round or oval shape as shown in FIG. 16. Once again, the channels 136 may be cut to a depth so as to expose the underlying surface of the printed circuit board 120, or alternatively, to leave a layer of the compliant material 132. By way of example, the height of each probe contact 130 as measured from the surface of the printed circuit board 120 to the end of the probe tip 110 will be in the order of about 90 to 165 microns. This is based upon a probe tip height of about 25–50 microns, a metal layer 108 of about 5 to 15 microns, a copper layer 112 of about 10 to 15 microns and a dielectric layer of about 50–75 microns. It should thus now be apparent that the geometric shape, matrix arrangement and/or center-to-center pitch of the probe contacts 130 can be varied to accommodate the design of the electronic element being tested.

A procedure for probing an electronic element 142 such as those described above is diagrammatically illustrated in FIG. 19. A probe card 140, which may have any of the configurations discussed above, is engaged with an electronic element 142 which in this case is a semiconductor wafer incorporating a plurality of semiconductor chips 144 having internal electronic devices 146 and surface chip contacts 148. The semiconductor chips 144 are delineated one from another by scribe lines 150.

In the probing method, the probe card 140 may, if desired, be initially heated to a temperature to cause the core elements 118 to reach their liquid or semi-liquid state. Alternatively, the core elements 118 will reach their liquid or semi-liquid state during the probing process. In either event, the probe card 140 is engaged with the electronic element 142 by disposing the probe card such that the individual probe tips 110 of the probe contacts 130 are aligned with the chip contacts 148. The probe card 140 is urged toward the electronic element 142, for example, by squeezing together using a pair of platens (not shown). Other elements such as fluid pressure devices, weights, springs or essentially any other device capable of applying force can be used to urge the probe card 140 and the electronic element 142 together. As the probe card 140 is urged towards the electronic element 142, the probe tips 110 are urged into engagement with the chip contacts 148. When the core elements 118 have reached their liquid or semi-liquid state, the core elements and surrounding encapsulant formed of the compliant layer 128 can deform so that the probe tips 110 can move. Such movement can include movement in both a vertical and horizontal direction towards, away from and laterally with respect to the chip contacts 148. This allows the probe contacts 130 to accommodate differences in height of the chip contacts 148 and/or probe tips 110 as, for example, where the front surface of the electronic element 142 is out of plane, thereby allowing reliable, consistent engagement of the probe tips with the chip contacts 148 on the electronic element 142.

While the probe card 140 is in engagement with the electronic element 142, the electronic devices 146 are actuated by sending signals through the circuit 134 of the probe card 140, so that signals pass to and from the electronic devices of the electronic element 142. The term "signals" as used herein should be understood broadly as including both time varying signals of the type commonly used as inputs and outputs and also including constant potential such as ground and power potentials which must be applied to or taken from the electronic element 142 under test.

The liquid or semi-liquid state of the core elements 118 prevent their cracking from stress which may be induced when forcing the probe tips 110 into engagement with the chip contacts 148 resulting from conditions such as non-planarity of the chip contacts or probe tips. Because the core elements 118 are in a liquid or semi-liquid form, they are not subject to fatigue during operation of the wafer probe at normal operating temperatures. Conversely, if the core elements 118 are in a solid state when contacting the chip contacts 148, there is the possibility of fracturing one of the core elements causing electrical discontinuity. However, as the probe card 140 heats up during the probing process, the core elements 118 will reach their liquid or semi-liquid state thereby automatically repairing itself.

After completion of the testing procedure, the probe card 140 can be separated from the electronic element 142 and the individual semiconductor chips 142 are separated from one another by cutting along the scribe lines 150. The probe card 140 can be used to test single chips having peripheral or area array contacts. It can also be used to test all or part of a full undiced wafer simultaneously. Alternatively, it could be used to test printed wiring boards and/or assembled packages, such as ball grid array packages.

When the power to the probe card 140 is turned off, the core elements 118 will cool and assume their solid state. The cycle of melting and freezing may be repeated an infinite number of times during the service life of the probe card 140. Defects which may occur in the core elements 118 are automatically repaired when the masses of the core elements melt and refreeze.

Although the invention herein has been described with reference to particular embodiments, it is to be understood that the embodiments are merely illustrative of the principles and application of the present invention. For example, the layer 128 can be rigid dielectric material. It is therefore to be understood that numerous modifications may be made to the embodiments and that other arrangements may be devised without departing from the spirit and scope of the present invention as defined by the claims.

What is claimed is:

1. A probe card for testing electronic elements, said probe card comprising a substrate, a layer of dielectric material having a plurality of cavities therein supported on said substrate, a mass of fusible conductive material having a melting temperature below about 150° C. disposed in each of said cavities, said dielectric material electrically insulating the masses of fusible conductive material from one another, and a probe tip of conductive material having a melting temperature greater than about 150° C. at one common end of each of the masses of fusible conductive material, said layer of dielectric material having a plurality of channels formed therein, whereby each of said mass of fusible conductive material is surrounded by said dielectric material forming a probe contact, each said probe contact being separated from an adjacent probe contact by at least one of said channels.

2. The probe card of claim 1, wherein said substrate includes electrical circuitry thereon, said circuitry having contacts, each said mass of fusible conductive material being bonded to one of said contacts.

3. The probe card of claim 1, wherein said cavities are arranged in a matrix.

4. The probe card of claim 1, wherein each said probe tip has sharp features.

5. The probe card of claim 4, wherein each said probe tip has a point.

6. The probe card of claim 1, wherein each said probe tip comprises tungsten material.

7. The probe card of claim 1, further including a copper layer between each said probe tip and each said mass of fusible conductive material.

8. The probe card of claim 1, wherein said substrate comprises a printed circuit board.

9. The probe card of claim 8, wherein said printed circuit board has a top and bottom surface supporting a respective plurality of first and second contacts, each said mass of fusible conductive material being bonded to one of said plurality of first contacts, said first and second contacts electrically connected by conductive elements therebetween.

10. The probe card of claim 1, wherein said channels partially extend to said substrate.

11. The probe card of claim 1, wherein said channels extend to said substrate for exposing an underlying surface thereof.

12. The probe card of claim 1, wherein said probe contact has a rectangular shape.

13. The probe card of claim 1, wherein said dielectric material comprises a polymer compliant material.

14. The probe card of claim 1, wherein said mass of fusible conductive material has a melting temperature below about 125° C.

15. The probe card of claim 1, wherein said mass of fusible conductive material has a melting temperature below about 100° C.

16. The probe card of claim 1, wherein said mass of fusible conductive material has a melting temperature in the range of about 25–65° C.

17. The probe card of claim 1, wherein said channels are devoid of said dielectric material.

18. A probe card for testing electronic elements, said probe card comprising a substrate including electrical circuitry thereon having contacts, a layer of dielectric material having a plurality of cavities therein supported on said substrate, a mass of fusible conductive material having a melting temperature below about 125° C. disposed in each of said cavities, each said mass of fusible conductive material being bonded to one of said contacts, said dielectric material electrically insulating the masses of fusible conductive material from one another, and a probe tip of conductive material having a melting temperature greater than about 125° C. at one common end of each of the masses of fusible conductive material, said layer of dielectric material having a plurality of channels formed therein, whereby each of said mass of fusible conductive material is surrounded by dielectric material forming a probe contact, each said probe contact being separated from an adjacent probe contact by at least one of said channels.

19. The probe card of claim 18, wherein said cavities are arranged in a matrix.

20. The probe card of claim 18, wherein each said probe tip has sharp features.

21. The probe card of claim 18, further including a metal layer between each said probe tip and each said mass of fusible conductive material.

22. The probe card of claim 18, wherein said substrate has a top and bottom surface supporting a respective plurality of first and second contacts, each said mass of fusible conductive material being bonded to one of said plurality of first contacts, said first and second contacts electrically connected by conductive elements therebetween.

23. The probe card of claim 18, wherein said channels partially extend to said substrate.

24. The probe card of claim 18, wherein said channels extend to said substrate for exposing an underlying surface thereof.

25. The probe card of claim 18, wherein said dielectric material comprises a polymer compliant material.

26. The probe card of claim 18, wherein said mass of fusible conductive material has a melting temperature below about 100° C.

27. The probe card of claim 18, wherein said mass of fusible conductive material has a melting temperature below about 85° C.

28. The probe card of claim 18, wherein said mass of fusible conductive material has a melting temperature in the range of about 25–65° C.

29. The probe card of claim 18, wherein said channels are devoid of said dielectric material.

30. A probe card test assembly comprising an electronic element having a plurality of contacts thereon; and a probe card comprising a substrate, a layer of dielectric material having a plurality of cavities therein supported on said substrate, a mass of fusible conductive material having a melting temperature below about 150° C. disposed in each of said cavities, said dielectric material electrically insulating the masses of fusible conductive material from one another, and a probe tip of conductive material having a melting temperature greater than about 150° C. at one common end of each of the masses of fusible conductive material, at least one of said probe tips in contact with one of said contacts on said electronic element, said layer of dielectric material having a plurality of channels formed therein, whereby each of said mass of fusible conductive material is surrounded by said dielectric material forming a probe contact, each said probe contact being separated from an adjacent probe contact by at least one of said channels.

31. The probe card test assembly of claim 30, wherein said substrate includes electrical circuitry thereon, said circuitry having contacts, each said mass of fusible conductive material being bonded to one of said contacts.

32. The probe card test assembly of claim 30, wherein said cavities are arranged in a matrix and said plurality of contacts are arranged in a corresponding matrix.

33. The probe card test assembly of claim 30, wherein said electronic element comprises a semiconductor chip.

34. The probe card test assembly of claim 30, wherein said channels partially extend to said substrate.

35. The probe card test assembly of claim 30, wherein said dielectric material comprises a polymer compliant material.

36. The probe card test assembly of claim 30, wherein said mass of fusible conductive material has a melting temperature below about 125° C.

37. The probe card test assembly of claim 30, wherein said mass of fusible conductive material has a melting temperature below about 100° C.

38. The probe card of claim 30, wherein said channels are devoid of said dielectric material.

39. A method of making a probe card comprising forming a plurality of cavities in a sacrificial first substrate, depositing a first metal over said substrate and into said cavities to form a plurality of probe tips, depositing a mass of fusible conductive material over each of said probe tips, providing a substrate having a plurality of contacts on one surface thereof facing said sacrificial substrate, bonding each said mass of fusible conductive material to a corresponding one of said contacts on said second substrate, providing a dielectric material between said first and second substrates surrounding each said mass of fusible conductive material to form a dielectric encapsulant layer encapsulating each said mass of conductive fusible material, removing said sacrificial first substrate, and at least partially separating each said mass of conductive fusible material within said encapsulant layer to form a plurality of individual contact probes each surrounded by said encapsulant layer.

40. The method of claim 39, wherein said first substrate comprises a silicon wafer.

41. The method of claim 40, wherein forming said plurality of cavities comprises anisotropically etching said silicon wafer.

42. The method of claim 39, wherein said first metal comprises tungsten.

43. The method of claim 39, wherein said fusible conductive material has a melting temperature below about 125° C.

44. The method of claim 39, wherein said separating step comprises separating said first metal on said first substrate for isolating each of said probe tips from an adjacent probe tip.

45. The method of claim 44, wherein said separating step further comprises forming a plurality of channels in said encapsulant layer.

46. The method of claim 39, further including depositing a copper layer between each said mass of fusible conductive material and said probe tips.

47. The method of claim 39, wherein said probe tips have sharp features.

48. The method of claim 39, wherein said first metal has a melting temperature greater than about 125° C.

49. The method of claim 39, wherein said separating step comprises separating said contact probes into rectangular shapes.

50. The method of claim 39, wherein said dielectric material comprises a polymer compliant material.

51. The method of claim 39, wherein said second substrate comprises a printed circuit board.

52. The method of claim 51, wherein said printed circuit board has a top and bottom surface supporting a respective plurality of first and second contacts, each said mass of fusible conductive material being bonded to one of said plurality of first contacts, said first and second contacts electrically connected by conductive elements therebetween.

53. The method of claim 39, wherein said separating step forms a plurality of channels within said encapsulant layer.

54. The method of claim 53, wherein said channels partially extend to said second substrate.

55. The method of claim 53, wherein said channels extend to said second substrate for exposing an underlying surface thereof.

56. The method of claim 39, wherein said fusible conductive material has a melting temperature below about 100° C.

57. The method of claim 39, wherein said fusible conductive material has a melting temperature below about 85° C.

58. The method of claim 39, wherein said fusible conductive material has a melting temperature in the range of about 25–65° C.

59. A method for testing an electronic element using a probe card, said method comprising providing a probe card having a substrate, a layer of dielectric material having a plurality of cavities therein supported on said substrate, a mass of fusible conductive material having a melting temperature disposed in each of said cavities, said dielectric material electrically insulating the masses of fusible conductive material from one another, and a probe tip of conductive material having a melting temperature greater than the melting temperature of said mass of fusible conductive material at one common end of each of the masses of fusible conductive material, said layer of dielectric material having a plurality of channels formed therein, whereby each of said mass of fusible conductive material is surrounded by said dielectric material forming a probe contact, each said probe contact being separated from an adjacent probe contact by at least one of said channels; positioning said probe card opposing an electronic element having a plurality of contacts thereon, at least one of said contacts engaged by one of said probe tips; heating said mass of fusible conductive material to at least the melting temperature of said fusible conductive material; and sending signals to said probe card and said electronic element.

60. The method of claim 59, wherein said mass of fusible conductive material has a melting temperature below about 150° C.

61. The method of claim 59, wherein said mass of fusible conductive material has a melting temperature below about 125° C.

62. The method of claim 59, wherein said mass of fusible conductive material has a melting temperature in the range of about 25–65° C.

63. The method of claim 59, further including engaging a plurality of said probe tips with a corresponding plurality of contacts on said electronic element.

64. The method of claim 59, wherein said probe card is made by forming a plurality of cavities in a sacrificial first substrate, depositing a first metal over said substrate and into said cavities to form a plurality of probe tips, depositing a mass of fusible conductive material over each of said probe tips, providing a substrate having a plurality of contacts on one surface thereof facing said sacrificial substrate, bonding each said mass of fusible conductive material to a corresponding one of said contacts on said second substrate, providing a dielectric material between said first and second substrates surrounding each said mass of fusible conductive material to form a dielectric encapsulant layer encapsulating each said mass of conductive fusible material, removing said sacrificial first substrate, and at least partially separating each said mass of conductive fusible material within said encapsulant layer to form a plurality of individual contact probes each surrounded by said encapsulant layer.

65. The method of claim 59, wherein said channels are devoid of said dielectric material.

\* \* \* \* \*

UNITED STATES PATENT AND TRADEMARK OFFICE
CERTIFICATE OF CORRECTION

PATENT NO.   : 6,586,955 B1
DATED        : July 1, 2003
INVENTOR(S)  : Joseph Fjelstad and John W. Smith It is certified that error appears in the above-identified patent and that said Letters Patent is hereby corrected as shown below:

Column 1,
Line 16, "so called" should read -- so-called --
Line 53, "is" should read -- are --

Column 5,
Line 2, "mass" should read -- masses --

Column 7,
Line 54, "form" should read -- forms --

Column 8,
Line 24, "solder" should read -- solders --

Column 12,
Line 19, "prevent" should read -- prevents --

Column 13,
Lines 3 and 66, "mass" should read -- masses --

Column 14,
Line 47, "mass" should read -- masses --

Column 16,
Line 24, "mass" should read -- masses --

Signed and Sealed this

Eighteenth Day of November, 2003

JAMES E. ROGAN
*Director of the United States Patent and Trademark Office*